(12) United States Patent  
Mihira (10) Patent No.: US 12,362,134 B2  
(45) Date of Patent: Jul. 15, 2025

(54) CHARGED PARTICLE BEAM APPARATUS AND IMAGE ADJUSTMENT METHOD

(71) Applicant: JEOL Ltd., Tokyo (JP)

(72) Inventor: Tomohiro Mihira, Tokyo (JP)

(73) Assignee: JEOL Ltd., Tokyo (JP)

( * ) Notice: Subject to any disclaimer, the term of this patent is extended or adjusted under 35 U.S.C. 154(b) by 455 days.

(21) Appl. No.: 17/951,951

(22) Filed: Sep. 23, 2022

(65) Prior Publication Data

US 2023/0100291 A1 Mar. 30, 2023

(30) Foreign Application Priority Data

Sep. 24, 2021 (JP) .................................. 2021-155341

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01)

(58) Field of Classification Search
CPC ........ H01J 37/222; H01J 37/244; H01J 37/28; H01J 2237/24495; H01J 37/265; H01J 37/268
See application file for complete search history.

(56) References Cited

U.S. PATENT DOCUMENTS

| 5,014,120 A * | 5/1991 | Numakura ............... H04N 9/64 348/E9.037 |
| 2006/0060783 A1 | 3/2006 | Armit |
| 2008/0283747 A1 | 11/2008 | Kawamata et al. |

(Continued)

FOREIGN PATENT DOCUMENTS

| JP | H0346743 A | 2/1991 |
| JP | 2008282761 A | 11/2008 |

(Continued)

OTHER PUBLICATIONS

Office Action issued in JP2021155341 on Aug. 1, 2023.

(Continued)

*Primary Examiner* — David A Vanore
(74) *Attorney, Agent, or Firm* — The Webb Law Firm (57) ABSTRACT

Provided is a charged particle beam apparatus that acquires an image by scanning a specimen with a charged particle beam, and includes a contrast adjustment circuit that adjusts contrast of the image; a brightness adjustment circuit that adjusts brightness of the image; and a control unit that controls the contrast adjustment circuit and the brightness adjustment circuit. The control unit acquires information on luminance of a reference image in a non-signal state, and information on an average value of luminance of each pixel of the reference image, controls the brightness adjustment circuit, based on the acquired information on luminance of the reference image in a non-signal state, acquires the image in a state where the brightness adjustment circuit is controlled, and adjusts the contrast of the acquired image by controlling the contrast adjustment circuit, based on the average value of luminance of each pixel of the reference image.

4 Claims, 4 Drawing Sheets

(56) References Cited

U.S. PATENT DOCUMENTS

| | | | | |
|---|---|---|---|---|
| 2010/0026722 A1* | 2/2010 | Kondo | ............... | G09G 5/02 |
| | | | | 345/660 |
| 2014/0061455 A1* | 3/2014 | Ishii | ............... | H01J 37/263 |
| | | | | 250/252.1 |
| 2018/0374674 A1* | 12/2018 | Itai | ............... | H01J 37/147 |

FOREIGN PATENT DOCUMENTS

| JP | 201453086 A | 3/2014 |
|---|---|---|
| JP | 201991715 A | 6/2019 |

OTHER PUBLICATIONS

Extended European Search Report issued in EP22196872.0 on Mar. 7, 2023.
Douglas B. Murphy, Fundamentals of Light Microscopy and Electronic Imaging, John Wiley & Sons, Inc., Dec. 31, 2001, ISBN: 978-0-47-125391-4, pp. 1-368.

\* cited by examiner

CHARGED PARTICLE BEAM APPARATUS AND IMAGE ADJUSTMENT METHOD

CROSS-REFERENCE TO RELATED APPLICATION

This application claims priority to Japanese Patent Application No. 2021-155341 filed Sep. 24, 2021, the disclosure of which is hereby incorporated by reference in its entirety.

BACKGROUND OF THE INVENTION

Field of the Invention

The present invention relates to a charged particle beam apparatus and an image adjustment method.

Description of Related Art

A charged particle beam apparatus, such as a scanning electron microscope and a focused ion beam apparatus, can acquire an image of a specimen. The scanning electron microscope, for example, can acquire a scanning electron microscope (SEM) image by scanning a specimen with an electron beam. The focused ion beam apparatus, for example, can acquire a scanning ion microscope (SIM) image by scanning a specimen with an ion beam.

In such a charged particle beam apparatus, contrast and brightness are normally adjusted when an image is acquired. For example, Japanese Patent Application Publication No. 2019-91715 discloses a scanning transmission electron microscope that adjusts contrast by adjusting gain to be added to an image signal of a detector, and adjusts brightness by adding offset to the image signal of the detector.

A known method for adjusting contrast and brightness is a method using a histogram of luminance. For example, a target dispersion value and a target average value are set, and a histogram of luminance is generated based on the image for which the adjustment is performed. Then the contrast is adjusted if the dispersion value of the luminance deviated from the target dispersion value, and the brightness is adjusted if the average value of the luminance deviated from the target average value.

However, in the case of this image adjustment method, if the contrast is adjusted because the dispersion value deviated from the target dispersion value, the average value also changes, hence the brightness has to be adjusted again. Thus in this image adjustment method, the contrast adjustment and the brightness adjustment has to be performed repeatedly, so that the dispersion value is converged to the target dispersion value and the average value is converged to the target average value.

SUMMARY OF THE INVENTION

According to the first aspect of the invention, there is provided a charged particle beam apparatus that acquires an image by scanning a specimen with a charged particle beam, the charged particle beam apparatus including:
  an optical system that scans the specimen with the charged particle beam;
  a detector that detects a signal generated by scanning the specimen with the charged particle beam;
  a contrast adjustment circuit that adjusts contrast of the image;
  a brightness adjustment circuit that adjusts brightness of the image; and
  a control unit that controls the contrast adjustment circuit and the brightness adjustment circuit,
  the control unit acquiring information on luminance of a reference image in a non-signal state, and information on an average value of luminance of each pixel of the reference image,
  the control unit controlling the brightness adjustment circuit, based on the acquired information on luminance of the reference image in the non-signal state,
  the control unit acquiring the image in a state where the brightness adjustment circuit is controlled, and
  the control unit adjusting the contrast of the acquired image by controlling the contrast adjustment circuit, based on the average value of luminance of each pixel of the reference image.

According to the second aspect of the invention, there is provided an image adjustment method for a charged particle beam apparatus that acquires an image by scanning a specimen with a charged particle beam, and includes a contrast adjustment circuit that adjusts contrast of the image, and a brightness adjustment circuit that adjusts brightness of the image, the method including:
  acquiring information on luminance of a reference image in a non-signal state, and information on an average value of luminance of each pixel of the reference image;
  controlling the brightness adjustment circuit, based on the acquired information on luminance of the reference image in the non-signal state;
  acquiring the image in a state where the brightness adjustment circuit is controlled; and
  adjusting the contrast of the acquired image by controlling the contrast adjustment circuit, based on the average value of luminance of each pixel of the reference image.

DESCRIPTION OF THE INVENTION

According to an embodiment of the invention, there is provided a charged particle beam apparatus that acquires an image by scanning a specimen with a charged particle beam, the charged particle beam apparatus including:
  an optical system that scans the specimen with the charged particle beam;
  a detector that detects a signal generated by scanning the specimen with the charged particle beam;

a contrast adjustment circuit that adjusts contrast of the image;

a brightness adjustment circuit that adjusts brightness of the image; and a control unit that controls the contrast adjustment circuit and the brightness adjustment circuit, the control unit acquiring information on luminance of a reference image in a non-signal state, and information on an average value of luminance of each pixel of the reference image, the control unit controlling the brightness adjustment circuit, based on the acquired information on luminance of the reference image in the non-signal state, the control unit acquiring the image in a state where the brightness adjustment circuit is controlled, and the control unit adjusting the contrast of the acquired image by controlling the contrast adjustment circuit, based on the average value of luminance of each pixel of the reference image.

In this charged particle beam apparatus, the control unit controls the brightness adjustment circuit based on the information on luminance of the reference image in the non-signal state, and adjusts the contrast of the acquired image by controlling the contrast adjustment circuit based on the average value of luminance of each pixel of the reference image. This means that this charged particle beam apparatus can independently perform the adjustment of brightness and the adjustment of contrast. Therefore this charged particle beam apparatus can easily perform the adjustment of brightness and the adjustment of contrast.

According to an embodiment of the invention, there is provided an image adjustment method for a changed particle beam apparatus that acquires an image by scanning a specimen with a charged particle beam and includes a contrast adjustment circuit that adjusts contrast of the image, and a brightness adjustment circuit that adjusts brightness of the image, the image adjustment method including:

acquiring information on luminance of a reference image in a non-signal state, and information on an average value of luminance of each pixel of the reference image;

controlling the brightness adjustment circuit, based on the acquired information on luminance of the reference image in the non-signal state;

acquiring the image in a state where the brightness adjustment circuit is controlled; and adjusting the contrast of the acquired image by controlling the contrast adjustment circuit, based on the average value of luminance of each pixel of the reference image.

This image adjustment method includes the step of controlling the brightness adjustment circuit based on the information on luminance of the reference image in the non-signal state, and the step of adjusting the contrast of the acquired image by controlling the contrast adjustment circuit based on the average value of luminance of each pixel of the reference image. This means that in this image adjustment method, the adjustment of brightness and the adjustment of contrast can be performed independently. Therefore in this image adjustment method, the adjustment of brightness and the adjustment of contrast can be easily performed.

Non-limiting embodiments of the invention will now be described in detail with reference to the drawings. The embodiments to be described below do not unduly limit the scope of the invention as stated in the claims. Furthermore, all of the components described below are not necessarily essential requirements of the invention.

1. Configuration of Focused Ion Beam Apparatus

Figure 1:
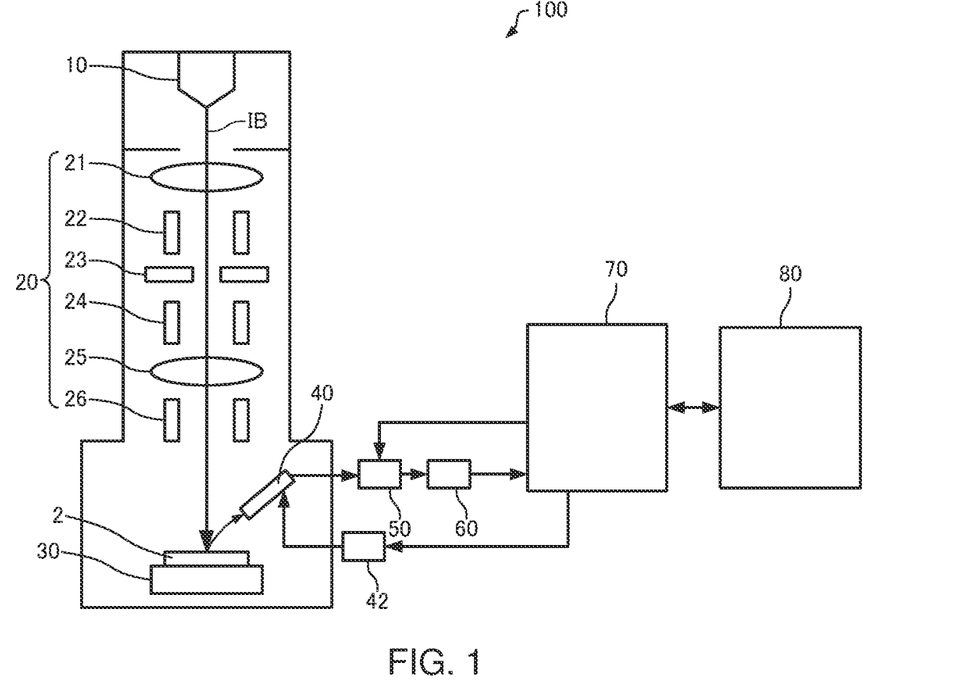
FIG. 1 is a diagram illustrating a configuration of a focused ion beam apparatus according to an embodiment of the invention.

A focused ion beam apparatus according to an embodiment of the invention will be described first with reference to the drawings. FIG. 1 is a diagram illustrating a configuration of the focused ion beam apparatus according to an embodiment of the invention.

As illustrated in FIG. 1, the focused ion beam apparatus 100 includes an ion source 10, an optical system 20, a specimen stage 30, a secondary electron detector 40, a contrast adjustment circuit 42, a preamplifier circuit 50, an amplifier circuit 60, a control unit 70 and a personal computer (PC) 80.

The focused ion beam apparatus 100 focuses an ion beam IB emitted from the ion source 10 using the optical system 20, and scans the specimen 2 with the focused ion beam, whereby the specimen 2 can be etched. Further, the focused ion beam apparatus 100 scans the specimen 2 with the ion beam IB, and detects electrons emitted from the specimen 2 using the secondary electron detector 40, whereby an SIM image can be acquired.

The ion source 10 emits the ion beam IB. The ion source 10 generates the ion beam IB using the electric field of an extraction electrode from a Ga liquid metal ion source, and accelerates the ion beam IB using the electric field of the cathode. Thereby the ion beam IB is emitted.

The optical system 20 includes a focusing lens 21, a blanker 22, a movable aperture 23, an astigmatism corrector 24, an objective lens 25 and a deflector 26.

The focusing lens 21 focuses the ion beam IB generated in the ion source 10. The blanker 22 performs blanking of the ion beam IB. The movable aperture 23 selectively limits the current amount of the ion beam IB. The astigmatism corrector 24 shapes the beam so that the cross-section of the emitted ion beam IB becomes a circle. The objective lens 25 focuses the ion beam IB on the surface of the specimen 2. The deflector 26 two-dimensionally deflects the ion beam IB focused by the objective lens 25. Thereby the specimen 2 can be scanned with the ion beam IB.

The specimen stage 30 holds a specimen 2. The specimen stage 30 can move the specimen 2 in the horizontal direction and in the vertical direction. The specimen stage 30 can also rotate or tilt the specimen 2.

The secondary electron detector 40 detects secondary electrons emitted from the specimen 2 by emitting the ion beam IB to the specimen 2. An image signal (intensity signal of secondary electrons) outputted from the secondary electron detector 40 is sent to the control unit 70 via the preamplifier circuit 50 and the amplifier circuit 60.

The control unit 70 performs image adjustment processing to adjust the brightness and the contrast of an SIM image. The image adjustment processing will be described later. The control unit 70 includes a central processing unit (CPU), and a storage device (e.g. random access memory (RAM), and read only memory (ROM)). The control unit 70 also performs various types of computing processing and various types of control processing by the CPU executing programs stored in the storage device. At least a part of the functions of the control unit 70 may be implemented by such a dedicated circuit as an ASIC (e.g. gate array).

The PC 80 includes a display which functions as a display unit, and an SIM image generated by the control unit 70 and a graphical user interface (GUI) to operate the focused ion beam apparatus 100 are displayed on the display.

Figure 2:
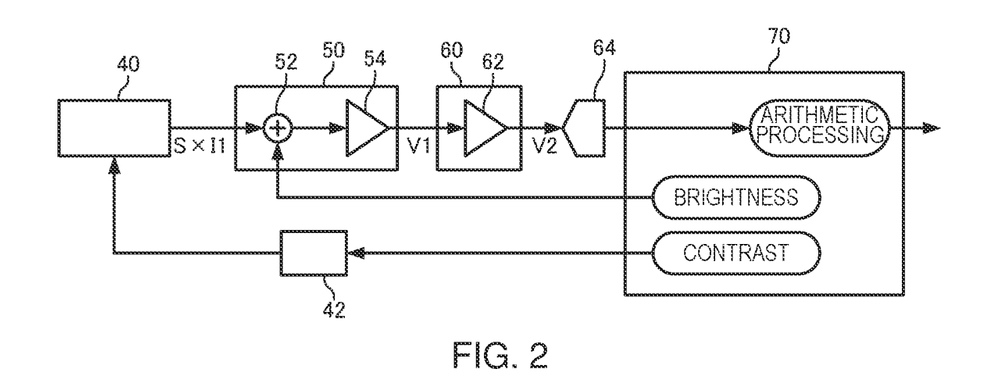
FIG. 2 is a diagram illustrating a configuration of a contrast adjustment circuit, a preamplifier circuit and an amplifier circuit.

FIG. 2 is a diagram illustrating a configuration of the contrast adjustment circuit 42, the preamplifier circuit 50 and the amplifier circuit 60.

The focused ion beam apparatus 100 adjusts the contrast and the brightness when an SIM image is observed.

The contrast is adjusted by controlling the gain that is added to the image signal. The contrast can be adjusted by the control unit 70 setting a contrast value for the contrast adjustment circuit 42. The brightness is adjusted by adjusting the offset that is added to the image signal. The brightness can be adjusted by the control unit 70 setting a brightness value for the preamplifier circuit 50.

The contrast adjustment circuit 42 receives information on the contrast value from the control unit 70, and controls the gain of the secondary electron detector 40 in accordance with the contrast value.

As illustrated in FIG. 2, the preamplifier circuit 50 includes an adder 52 and an amplifier 54.

The image signal, which is detected by the secondary electron detector 40 after adjusting the contrast, is a product of the current value (emission current) I1 of the ion beam IB emitted to the specimen 2 and the luminous component S of the specimen 2 (S×I1). A brightness value B is added to the image signal (S×I1) by the adder 52, and is amplified Gp times by the amplifier 54. Therefore the output signal V1 of the preamplifier circuit 50 is expressed by V1=Gp×(S×I1+B). The preamplifier circuit 50 functions as the brightness adjustment circuit to adjust the brightness.

The amplifier circuit 60 includes an amplifier 62. The output signal V1 of the preamplifier circuit 50 is amplified Ga times by the amplifier 62. Therefore the output signal V2 of the amplifier circuit 60 is expressed by V2=Ga×Gp×(S×I1+B).

The output signal V2 of the amplifier circuit 60 is A/D-converted by an A/D convertor 64, and is sent to the control unit 70. Predetermined arithmetic processing is performed on the image signal by the control unit 70, whereby the SIM image is generated. For example, the SIM image that indicates the distribution of the intensity of the secondary electrons is generated based on the image signal and the position information (coordinates) where this image signal was acquired. The SIM image generated by the control unit 70 is displayed on the display of the PC 80.

2. Image Adjustment Method

In the focused ion beam apparatus 100, the control unit 70 performs the image adjustment processing for adjusting the brightness and the contrast. The image adjustment processing will be described in detail.

2.1. Acquisition of Reference Image

First, the focused ion beam apparatus 100 acquires a reference image to be the reference of the adjustment of the brightness and the contrast. For example, the reference image is acquired by the user adjusting the brightness and the contrast such that the SIM image (hereafter simply called "image") has a desired brightness and contrast. By the control unit 70 adjusting the brightness and the contrast using the reference image, an image having the same brightness and contrast as the reference image can be acquired.

2.2. Index for Adjusting Brightness

In the focused ion beam apparatus 100, luminance of an image in a non-signal state is used as an index for adjusting brightness. The luminance of an image in a non-signal state refers to the luminance of the image when a non-signal state is generated in a state where the brightness value, used when the image was acquired, is set. The non-signal state refers to a state where secondary electrons (signals) are not detected by the secondary electron detector 40.

As mentioned above, the output signal V2 of the amplifier circuit 60 is expressed by V2=Ga×Gp×(S×I1+B). In other words, the luminance of a pixel becomes a value in accordance with the output signal V2=Ga×Gp×(S×I1+B) of the amplifier circuit 60. Here S×I1 is 0 in the non-signal state. That is, the luminance in the non-signal state becomes a value in accordance with V2=Ga×Gp×B. Therefore the luminance in the non-signal state can be used as the index for adjusting the brightness.

The state, where the gain to be set in the secondary electron detector 40 is zero, is the same as the state where secondary electrons (signals) are not detected by the secondary electron detector 40. In other words, the luminance in the non-signal state is the same as the luminance in the state where the gain is zero. Therefore the luminance in the state where the gain is zero may be used as the luminance in the non-signal state.

As mentioned above, the output signal V2 of the amplifier circuit 60 is expressed by V2=Ga×Gp×(S×I1+B). In the case where the gain is set to zero, S×I1 becomes 0. That is, in the case where the gain is set to zero, V2=Ga×Gp×B is established. Therefore the luminance in the state where the gain is zero can be used as the luminance in the non-signal state.

In the non-signal state, luminance values of all the pixels are ideally the same, hence the luminance in the non-signal state may be an average value of luminance of each pixel of the image in the non-signal state, that is, a value determined by dividing the sum of the luminance values of all the pixels by a number of pixels, or may be a luminance of any one pixel.

The control unit 70 adjusts the brightness using the luminance of the image in the non-signal state as an index. The control unit 70 uses the luminance of the reference image in the non-signal state for a target value of the luminance of the image in the non-signal state (hereafter called "target brightness value").

Figure 3:
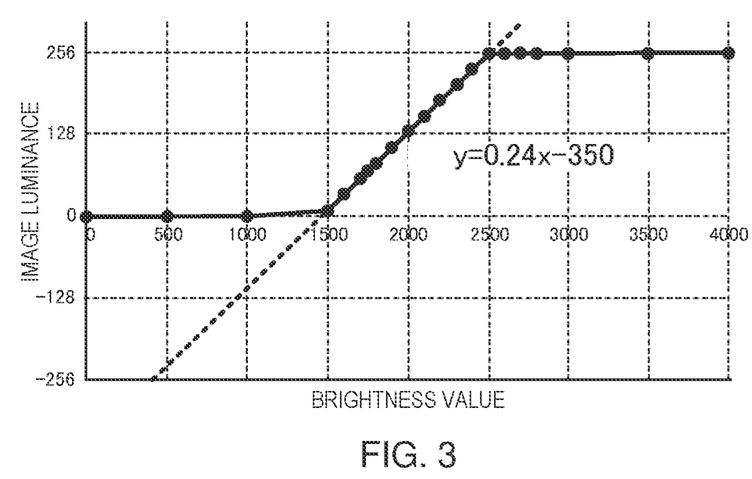
FIG. 3 is a graph illustrating a relational expression between luminance in the non-signal state and the brightness value.

FIG. 3 is a graph illustrating a relational expression between the luminance in the non-signal state and the brightness value in the focused ion beam apparatus 100.

The luminance of the reference image in the non-signal state can be determined based on the brightness value when the reference image was acquired, using the relational expression between the luminance in the non-signal state and the brightness value in FIG. 3. In the example in FIG. 3, the luminance of the reference image in the non-signal state can be determined by substituting the brightness value when the reference image was acquired for x in the relational expression y=0.24x−350.

The relational expression in FIG. 3 can be determined by measuring the luminance in the non-signal state while changing the brightness value in the focused ion beam apparatus 100, plotting the measurement result in the graph and approximating the plotted result by linear approximation. The relational expression in FIG. 3 is unique to the apparatus.

For the target brightness value, the brightness value when the reference image was acquired can be used directly. However, if the brightness value is used directly as the target brightness value, this target value can be used only for the apparatus for which the target value was acquired. By using the luminance in the non-signal state for the target brightness value, the target brightness can also be used for other apparatuses.

2.3. Brightness Adjustment Method

The control unit 70 controls the preamplifier circuit 50 based on the information on the luminance of the reference image in the non-signal state.

Specifically, the control unit 70 first determines the brightness value based on the target brightness value, using the relational expression between the luminance of the image in the non-signal state and the brightness value in FIG. 3.

As mentioned above, the target brightness value is a luminance of the reference image in the non-signal state. The brightness value can be determined by substituting the luminance of the reference image in the non-signal state in the relational expression in FIG. 3. In the example in FIG. 3, the brightness value can be determined by substituting the target brightness value for y in the relational expression y=0.24x−350.

Then the control unit 70 controls the preamplifier circuit 50 such that the offset in accordance with the determined brightness value is added to the image signal. Thereby the brightness can be adjusted.

2.4. Index for Adjusting Contrast

In the focused ion beam apparatus 100, an average value of the luminance of each pixel of the image (hereafter called "average luminance") is used as the index for adjusting contrast. The average luminance is a value determined by dividing the sum of luminance values of all the pixels of the image by a number of pixels.

The control unit 70 adjusts the contrast using the average luminance as an index. The control unit 70 uses the average value of the luminance of each pixel of the reference image (hereafter called "average luminance of reference image") for a target value of the average luminance (hereafter called "target contrast value").

2.5. Contrast Adjustment Method

The control unit 70 adjusts contrast after the above mentioned adjustment of the brightness ends. The control unit 70 controls the preamplifier circuit 50 based on the average luminance of the reference image.

Specifically, the control unit 70 first determines the contrast value based on the target contrast value, using a relational expression between the average luminance and the contrast value.

Figure 4:
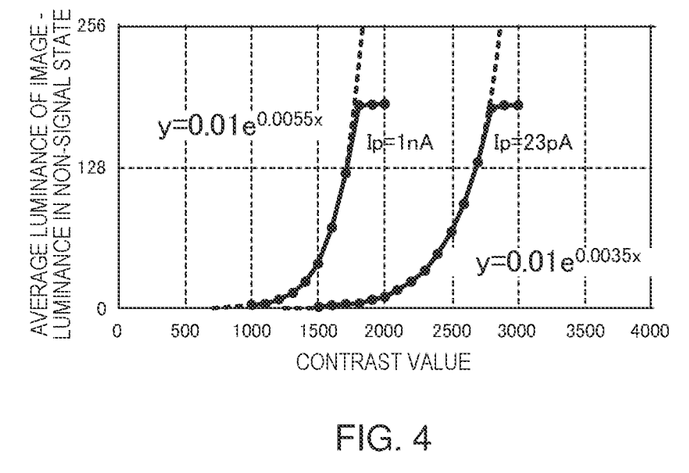
FIG. 4 is a graph illustrating a relational expression between an average value of luminance of each pixel of an image and the contrast value.

FIG. 4 is a graph illustrating the relational expression of the average luminance and the contrast value in the focused ion beam apparatus 100. FIG. 4 illustrates the relational expressions in cases where the illumination current Ip is Ip=1 nA, and is Ip=23 pA. In FIG. 4, the ordinate y indicates a value determined by subtracting the luminance in the non-signal state from the average luminance.

As mentioned above, the target contrast value is the average luminance of the reference image. The contrast value can be determined by substituting the average luminance of the reference image in the relational expression in FIG. 4. In the case of the example in FIG. 4, the contrast value can be determined by substituting the target contrast value for y in the relational expression $y=0.01e^{0.0055x}$, for example.

The relational expression in FIG. 4 can be determined by calculating the average value of the luminance of each pixel of the image while changing the contrast value in the focused ion beam apparatus 100, plotting the calculation result in the graph, and approximating the plotted result by exponential approximation. The relational expression in FIG. 4 is unique to the apparatus. As illustrated in FIG. 4, the relational expression may be determined for each illumination current Ip.

Then the control unit 70 controls the contrast adjustment circuit 42 such that the gain in accordance with the determined value is added to the image signal. As a result, a gain in accordance with the contrast value is set in the secondary electron detector 40. Thereby the contrast can be adjusted.

3. Principle of Image Adjustment

Figure 5:
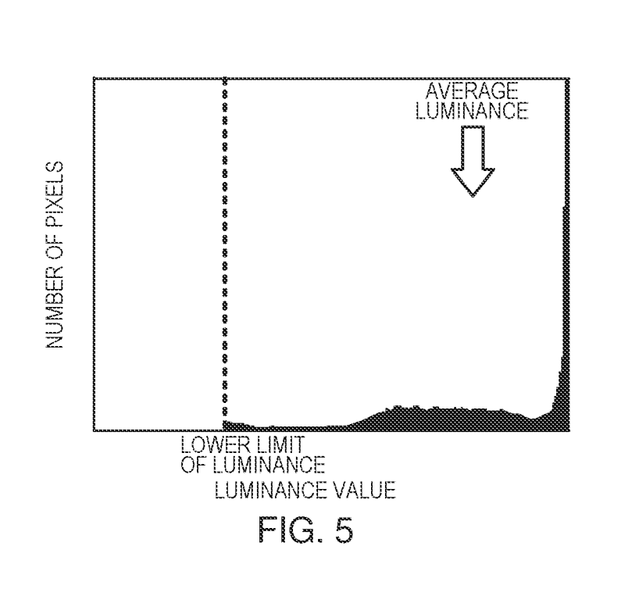
FIG. 5 illustrates an example of a luminance histogram of an image.
Figure 6:
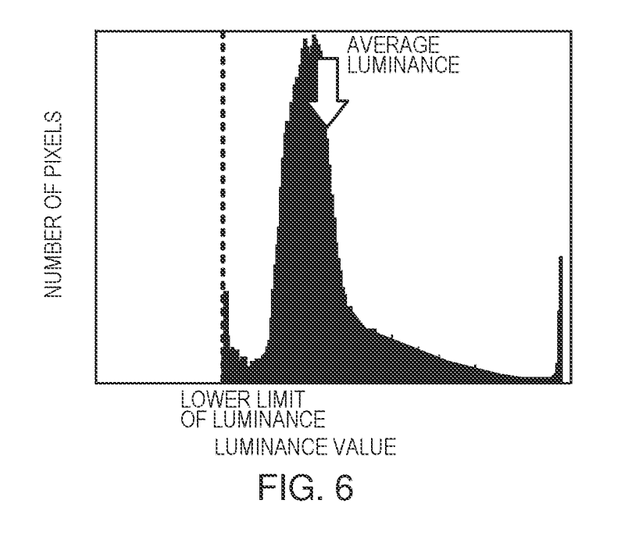
FIG. 6 illustrates an example of a luminance histogram of an image.

FIG. 5 and FIG. 6 illustrate examples of a luminance histogram of an image acquired by the focused ion beam apparatus 100.

As mentioned above, the brightness is adjusted first. In the brightness adjustment, the brightness value is determined such that the luminance in the non-signal state matches with the luminance of the reference image in the non-signal state. As a result, the lower limit value of the luminance is determined in the histogram in FIG. 5.

Then the contrast is adjusted. In the contrast adjustment, the contrast value is determined such that the average luminance of the acquired image matches with the average luminance of the reference image. As a result, the average luminance of the acquired image is determined as illustrated in FIG. 6. By the above processing steps, the adjustment of brightness and the adjustment of contrast can be performed on the image.

As illustrated in FIG. 5 and FIG. 6, the lower limit value of the luminance does not change even if the contrast is adjusted. Therefore according to the image adjustment method in the focused ion beam apparatus 100, the adjustment of brightness and the adjustment of contrast can be performed independently.

4. Processing

Figure 7:
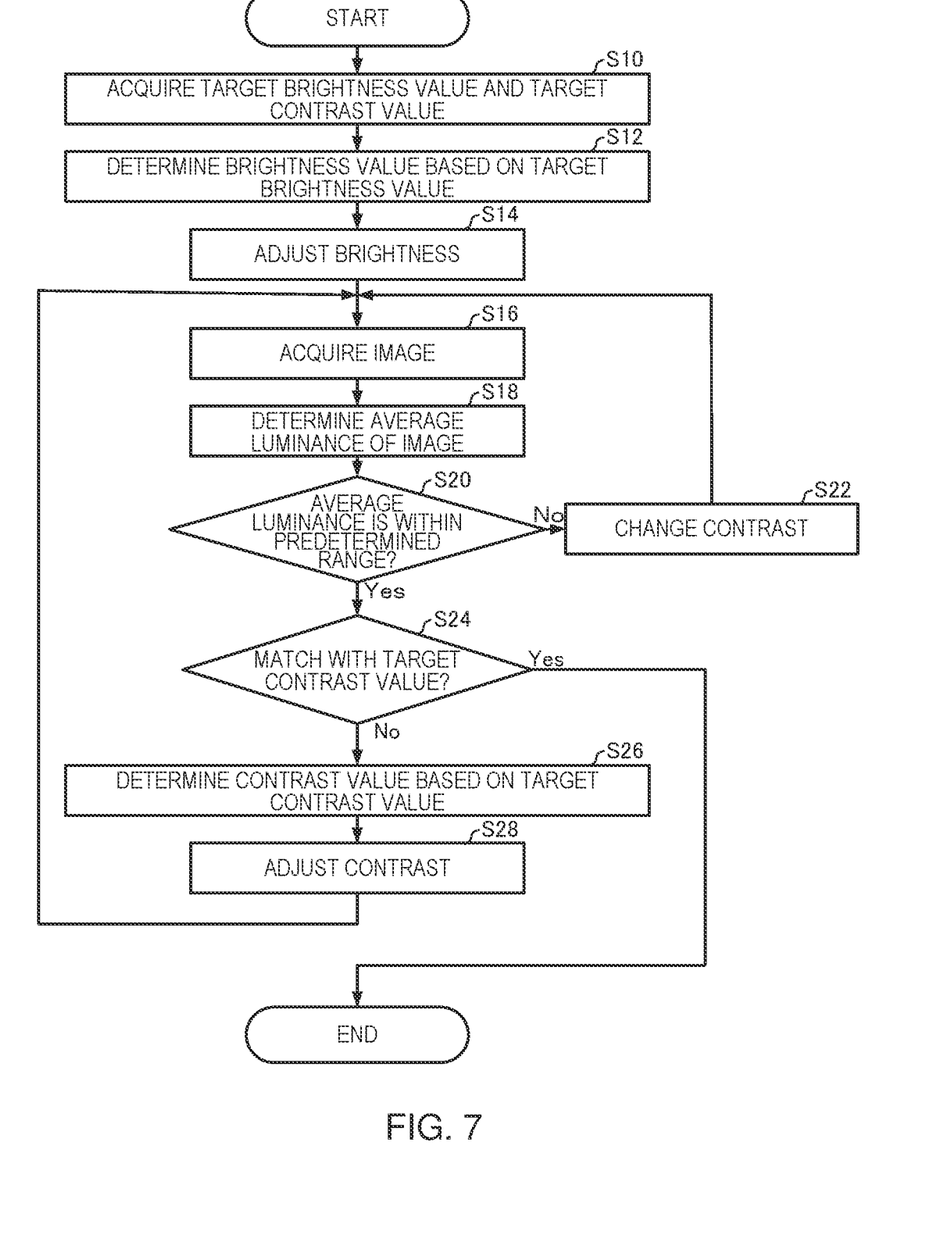
FIG. 7 is a flow chart illustrating an example of image adjustment processing of a processing unit.

FIG. 7 is a flow chart illustrating an example of the image adjustment processing by the control unit 70.

First the control unit 70 acquires the target brightness value (luminance of the reference image in the non-signal state) to adjust the brightness, and the target contrast value (average value of luminance of each pixel of the reference image) to adjust the contrast (S10).

For example, while checking the image displayed on the display of the PC 80, the user manually adjusts the brightness and the contrast of the image to a desired state. When a predetermined button is pressed on the GUI to operate the focused ion beam apparatus 100 in this state, the control unit 70 acquires information on the luminance of the reference image in the non-signal state and information on the average value of the luminance of each pixel of the reference image.

The control unit 70 acquires the information on the brightness value when the reference image was acquired, calculates the luminance in the non-signal state using the relational expression between the luminance in the non-signal state and the brightness value in FIG. 3, and acquires the target brightness value thereby. The control unit 70 also calculates the average luminance of the reference image and acquires the target contrast value.

In the above description, the information on the luminance of the reference image in the non-signal state and the information on the average value of luminance of each pixel of the reference image are acquired for the entire image, but a region to acquire this information may be specified. In other words, the information on the luminance of the reference image in the non-signal state and the information on the average value of luminance of each pixel of the reference image may be acquired in the specified region of the image.

Then the control unit 70 determines the brightness value based on the target brightness value (S12). The control unit 70 determines the brightness value based on the acquired target brightness value using the relational expression between the luminance of the image in the non-signal state and the brightness value in FIG. 3.

Then the control unit 70 adjusts the brightness (S14). The control unit 70 controls the preamplifier circuit 50 such that offset in accordance with the determined brightness value is added to the image signal.

Then the control unit 70 acquires an image in a state where the preamplifier circuit 50 is controlled, that is, in a state where the offset in accordance with the determined brightness value is added to the image signal (S16). The control unit 70 controls the optical system 20 so as to scan the specimen 2 with the ion beam IB, and acquires the image signal outputted from the secondary electron detector 40 via the preamplifier circuit 50 and the amplifier circuit 60, so as to generate an image (SIM image). Thereby the image can be acquired.

Then the control unit 70 determines the average luminance of the acquired image (S18). The control unit 70 determines whether the average luminance of the acquired image is within a predetermined range (S20).

For example, if the luminance is represented by 256 tones, the predetermined range is set from 50 to 200. Thereby a saturated image or an extremely dark image can be eliminated from processing targets. The predetermined range is changeable when necessary.

If it is determined that the average luminance is not within the predetermined range (No in S20), the control unit 70 changes the contrast by a predetermined amount (S22). Specifically, if the average luminance is less than 50, the control unit 70 changes the contrast by a predetermined amount so that the average luminance increases. In other words, the control unit 70 increases the contrast value by a predetermined amount. If the average luminance exceeds 200, the control unit 70 changes the contrast by a predetermined amount so that the average luminance decreases. In other words, the control unit 70 decreases the contrast value by a predetermined amount. The predetermined amount is an amount that is set in advance, for example. The predetermined amount is changeable when needed.

After changing the contrast by the predetermined amount, the control unit 70 returns to processing S16 and acquires an image (S16), determines the average luminance of the acquired image (S18) and determines whether the average luminance is within a predetermined range (S20). The control unit 70 repeats the processing steps S16, S18, S20 and S22 until it is determined that the average luminance of the acquired image is within the predetermined range.

If it is determined that the average luminance is within the predetermined range (Yes in S20), the control unit 70 determines whether the average luminance of the acquired image matches with the target contrast value (S24). In other words, the control unit 70 determines whether the average luminance of the acquired image matches with the average luminance of the reference image.

If it is determined that the average luminance of the acquired image does not match with the target contrast value (No in S24), the control unit 70 determines the contrast value based on the average luminance of the reference image (S26). The control unit 70 determines the contrast value based on the target contrast value using the relational expression between the average luminance and the contrast value in FIG. 4.

Then the control unit 70 adjusts contrast (S28). The control unit 70 controls the contrast adjustment circuit 42 so that a gain in accordance with the determined contrast value is added to the image signal. Thereby the gain in accordance with the contrast value is set in the secondary electron detector 40.

After adjusting the contrast (S28), the control unit 70 returns to processing S16, and performs the processing to acquire an image (S16), the processing to determine the average luminance of the acquired image (S18), and the processing to determine whether the average luminance is within a predetermined range (S20). The control unit 70 repeats the processing steps S16, S18, S20, S22, S24, S26 and S28 until it is determined that the average luminance of the acquired image matches with the target contrast value.

If it is determined that the average luminance of the acquired image matches with the target contrast value (Yes in S24), the control unit 70 ends the image adjustment processing.

Here it is determined whether the average luminance of the image acquired in the processing S24 matches with the target contrast value, but it is sufficient if the need for contrast adjustment can be determined by comparing the average luminance of the acquired image and the target contrast value. Therefore the contrast value may be determined (S26) and the contrast is adjusted (S28) in the case where the difference between the average luminance of the acquired image and the target contrast value is larger than a predetermined value, for example.

In the above description, in the processing S10, the user generates the reference image by adjusting the brightness and the contrast, and acquires the target brightness value and the target contrast value, but the target brightness value and the target contrast value may be set in the control unit 70 in advance.

5. Effects

The focused ion beam apparatus 100 includes: the contrast adjustment circuit 42 to adjust the contrast of the image; the brightness adjustment circuit (preamplifier circuit 50) to adjust the brightness of the image; and the control unit 70 to control the contrast adjustment circuit 42 and the preamplifier circuit 50. The control unit 70 acquires the information on the luminance of the reference image in the non-signal state and the information on the average value of luminance of each pixel of the reference image, and controls the preamplifier circuit 50 based on the acquired information on the luminance in the non-signal state. Further, the control unit 70 acquires an image in a state where the preamplifier circuit 50 is controlled, and adjusts the contrast of the acquired image by controlling the contrast adjustment circuit 42 based on the average value of luminance of each pixel of the reference image.

Therefore in the focused ion beam apparatus 100, the adjustment of brightness and the adjustment of contrast can be performed independently. For example, in the case where the contrast and the brightness are adjusted using the dispersion value and average of the luminance as indexes, the adjustment of contrast and the adjustment of brightness must be repeated so that the dispersion value and the average converge to the target values respectively.

In the focused ion beam apparatus 100, on the other hand, the adjustment of brightness and the adjustment of contrast can be performed independently, hence such a number of repetitions can be decreased. Therefore the focused ion beam apparatus 100 can easily perform the adjustment of brightness and the adjustment of contrast.

Further, in the focused ion beam apparatus 100, the luminance dispersion value of the image is not used as an index for the adjustment of contrast, hence stable adjustment is performed even in the case of an image which does not have a structure and of which change in contrast is small, for example. If the contrast is adjusted using the luminance dispersion value as an index for an image which does not have a structure and of which change in contrast is small, for example, the dispersion value is increased (width of histogram is increased) in accordance with the target dispersion value, hence in some cases noise in the image is heightened. If the contrast is adjusted using the average luminance of the image as an index, on the other hand, an image having a good contrast can be acquired without heightening noise, even if the change in contrast is small.

Furthermore, by using the luminance in the non-signal state as an index to adjust the contrast and using the average luminance as an index to adjust the brightness, the image can be adjusted using the same target values even for different apparatuses. For example, the image can be adjusted using the same target values even for different apparatuses by providing the relational expression between the luminance in the non-signal state and the brightness value and the relational expression between the average luminance and the control value for each apparatus.

In the focused ion beam apparatus 100, the preamplifier circuit 50 controls the offset to be added to the image signal, which is outputted by the secondary electron detector 40, in accordance with the brightness value, and the control unit 70 determines the brightness value based on the information on the luminance of the reference image in the non-signal state, using the relational expression between the luminance of the image in the non-signal state and the brightness value. Thus in the focused ion beam apparatus 100, the brightness can be adjusted based on the luminance of the reference image in the non-signal state.

In the focused ion beam apparatus 100, the contrast adjustment circuit 42 controls the gain of the secondary electron detector 40 in accordance with the contrast value, and the control unit 70 determines the contrast value based on the information on the average value of the luminance of each pixel of the reference image, using the relational expression between the average value of the luminance of each pixel of the image and contrast value. Thus in the focused ion beam apparatus 100, the brightness can be adjusted based on the average value of the luminance of each pixel of the reference image.

6. Modifications

For example, in the case of acquiring an image automatically in the focused ion beam apparatus 100, the target brightness value and the target contrast value may be added to the setting (recipe) of the automatic operation. The target brightness value and the target contrast value in this case may be values that are set in advance, or may be the target brightness value and the target contrast value which the user acquired from an image they desired. As mentioned above, the target brightness value and the target contrast value can be used for different apparatuses, hence a desired image can be acquired by including these target values in the recipe in advance, even in the case of acquiring the image automatically. Furthermore, the recipe can be shared by different apparatuses.

Further, in the above description, the focused ion beam apparatus that scans a specimen with the ion beam was used as an example of the charged particle beam apparatus according to the invention, but the changed particle beam apparatus according to the invention may be an electron microscope, such as a scanning electron microscope and a scanning transmission electron microscope, that scans a specimen with an electron beam, for example.

The above-mentioned embodiments and modifications are examples, and the invention is not limited thereto. For example, the embodiments and the modifications may be combined appropriately.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam apparatus configured to acquire an image by scanning a specimen with a charged particle beam, the charged particle beam apparatus comprising:
   an optical system configured to scan the specimen with the charged particle beam;
   a detector configured to detect a signal generated by scanning the specimen with the charged particle beam;
   a contrast adjustment circuit configured to adjust contrast of the image by controlling a gain of the detector in accordance with a contrast value;
   a brightness adjustment circuit configured to adjust brightness of the image; and
   a control unit configured to control the contrast adjustment circuit and the brightness adjustment circuit,
   the control unit acquiring information on luminance of a reference image in a non-signal state, and information on an average value of luminance of each pixel of the reference image,
   the control unit controlling the brightness adjustment circuit, based on the acquired information on luminance of the reference image in the non-signal state,
   the control unit acquiring the image in a state where the brightness adjustment circuit is controlled,
   the control unit determines the contrast value, based on the average value of luminance of each pixel of the reference image, and
   the control unit adjusting the contrast of the acquired image by controlling the contrast adjustment circuit, based on the contrast value.

2. The charged particle beam apparatus according to claim 1, wherein
   the brightness adjustment circuit controls an offset to be added to an image signal outputted by the detector, in accordance with a brightness value, and
   the control unit determines the brightness value, based on the information on illuminance of the reference image in the non-signal state by using a relational expression between the illuminance of the image in the non-signal state and the brightness value.

3. The charged particle beam apparatus according to claim 1, wherein
   the control unit determines the contrast value, based on the information on an average value of luminance of each pixel of the reference image by using a relational expression between an average value of luminance of each pixel of the image and the contrast value.

4. An image adjustment method for a charged particle beam apparatus that acquires an image by scanning a specimen with a charged particle beam and includes a contrast adjustment circuit that adjusts contrast of the image by controlling a gain of the detector in accordance with a contrast value, and a brightness adjustment circuit that adjusts brightness of the image, the image adjustment method comprising:

acquiring information on luminance of a reference image in a non-signal state, and information on an average value of luminance of each pixel of the reference image;

controlling the brightness adjustment circuit, based on the acquired information on luminance of the reference image in the non-signal state;

acquiring the image in a state where the brightness adjustment circuit is controlled;

determining the contrast value, based on the average value of luminance of each pixel of the reference image, and adjusting the contrast of the acquired image by controlling the contrast adjustment circuit, based on the contrast value.

* * * * *